United States Patent
Boecker

(10) Patent No.: US 6,614,318 B1
(45) Date of Patent: Sep. 2, 2003

(54) VOLTAGE CONTROLLED OSCILLATOR WITH JITTER CORRECTION

(75) Inventor: Charles W. Boecker, Ames, IA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/011,475

(22) Filed: Nov. 5, 2001

(51) Int. Cl.$^7$ ................................................ H03L 7/00
(52) U.S. Cl. ........................................... 331/17; 331/11
(58) Field of Search ............................... 331/17, 11, 10, 331/25

(56) References Cited

U.S. PATENT DOCUMENTS 3,909,735 A * 9/1975 Anderson et al. ............. 331/10
5,208,546 A * 5/1993 Nagaraj et al. .............. 327/157

* cited by examiner

Primary Examiner—Robert Pascal
Assistant Examiner—Joseph Chang
(74) Attorney, Agent, or Firm—E. Eric Hoffman; Bever Hoffman & Harms

(57) ABSTRACT

A phase controller is coupled to a voltage-controlled oscillator (VCO) in a feedback configuration, thereby reducing the phase noise introduced by the VCO. As a result, circuits using the VCO, such as phase-locked loops or delay locked loops, will exhibit reduced jitter in the resulting output signals. In one embodiment, the phase controller measures successive actual periods of the VCO output clock, and in response, generates a control voltage representative of deviations in the successive actual periods of the VCO output clock. The phase controller transmits the control voltage to the VCO as a feedback control voltage. The VCO adjusts the actual period of the VCO output clock in response to the control voltage. More specifically, the VCO adjusts the actual period of the VCO output clock such that deviations in the successive actual periods of the VCO output clock are reduced.

26 Claims, 7 Drawing Sheets

VOLTAGE CONTROLLED OSCILLATOR WITH JITTER CORRECTION

BACKGROUND OF THE INVENTION

FIELD OF THE INVENTION

The present invention relates to an architecture for a voltage controlled oscillator (VCO) circuit. More specifically, the present invention relates to a VCO circuit having an output with a reduced amount of jitter. VCO circuits are commonly implemented in phase-locked loop (PLL) circuits.

RELATED ART

FIG. 1 is a block diagram of a conventional phase-locked loop (PLL) circuit 100. PLL circuit 100 includes voltage controlled oscillator (VCO) 101, phase comparator 102, loop filter 103 and divider circuit 104. VCO 101 generates an output clock signal, $VCO_{OUT}$, in response to a frequency control feedback voltage ($PLL_{FB}$) provided by loop filter 103. VCO 101 is an analog device, which is designed to generate a $VCO_{OUT}$ signal having a frequency that is controllable within a range about a desired frequency. The $VCO_{OUT}$ signal is provided to phase comparator 102 through divider 104. In the present description, divider 104 provides a divide-by-one function, such that the $VCO_{OUT}$ signal is provided to phase comparator 102. Phase comparator 102 is also coupled to receive a reference clock signal $CLK_{REF}$. Phase comparator 102 determines the phase difference between the $VCO_{OUT}$ and $CLK_{REF}$ signals, and in response, generates an ERROR signal, which is representative of this phase difference. Phase comparator 102 includes phase/frequency detector 111 and charge pump 112, which are well-known, conventional elements.

Loop filter 103 integrates the ERROR signal, thereby creating the frequency control feedback voltage $PLL_{FB}$. The frequency control voltage $PLL_{FB}$, in turn, controls the frequency of the $VCO_{OUT}$ signal generated by VCO 101.

If the $VCO_{OUT}$ signal lags in phase with respect to the $CLK_{REF}$ signal, then phase comparator 102 generates an ERROR signal having a first logic level (e.g., $V_{cc}$). Loop filter 103 integrates this ERROR signal to create the frequency control voltage. This frequency control voltage, when applied to VCO 101, causes the frequency of the $VCO_{OUT}$ signal to increase, thereby causing the $VCO_{OUT}$ signal to gain in phase with respect to the $CLK_{REF}$ signal.

Similarly, if the $VCO_{OUT}$ signal leads in phase with respect to the $CLK_{REF}$ signal, then phase comparator 102 generates an ERROR signal having a second logic level (e.g., $V_{SS}$). Loop filter 103 integrates this ERROR signal to create the frequency control voltage. This frequency control voltage, when applied to VCO 101, causes the frequency of the $VCO_{OUT}$ signal to decrease, thereby causing the $CLK_{REF}$ signal to gain in phase with respect to the $VCO_{OUT}$ signal.

In the foregoing manner, PLL circuit 100 continuously adjusts the frequency of the $VCO_{OUT}$ signal to eliminate any phase difference between the $CLK_{REF}$ and $VCO_{OUT}$ signals. The operating parameters of VCO 101, phase comparator 102 and loop filter 103 are selected to provide a stable closed loop control system. As a result, PLL circuit 100 ultimately eliminates the phase difference between the $VCO_{OUT}$ and $CLK_{REF}$ signals. At this time, the $VCO_{OUT}$ and $CLK_{REF}$ signals will be matched in both frequency and phase (i.e., synchronized). Under these conditions, PLL circuit 100 is said to be "locked". PLL circuit 100 remains locked by continual small adjustments of VCO 101 based on the feedback received from phase comparator 102 and loop filter 103.

One of the most important characteristics of PLL circuit 100 is the jitter that is produced or transferred to the output signal ($VCO_{OUT}$) of PLL circuit 100. The PLL loop bandwidth is the main characteristic that determines the amount of jitter at the output of PLL circuit 100.

FIG. 2 is a graph that illustrates the PLL loop bandwidth of PLL circuit 100. More specifically, FIG. 2 illustrates that PLL circuit 100 acts as a low-pass filter with respect to reference clock noise ($\Phi n$ REF), and a high-pass filter with respect to VCO noise ($\Phi n$ VCO). These sources are the main contributors to PLL jitter. In order to reduce the noise from the reference clock, the PLL loop bandwidth should be decreased as much as possible. In order to reduce the noise from VCO 101, the PLL loop bandwidth should be increased as much as possible. However, these two requirements are in conflict with each other. As a result, a significant amount of jitter results from the VCO noise ($\Phi n$ VCO) and the reference clock noise ($\Phi n$ REF).

It would therefore be desirable to have a method and structure for reducing the amount of jitter present in the output signal of a PLL circuit.

SUMMARY

Accordingly, the present invention provides a PLL circuit that includes a phase controller coupled to a voltage-controlled oscillator (VCO) in a feedback configuration. The phase controller significantly reduces the VCO phase noise ($\Phi n$ VCO). As a result, a circuit using the VCO (e.g., a PLL circuit) will provide an output signal that exhibits reduced jitter. In one embodiment, the phase controller is coupled to receive the output clock of the VCO. In response, the phase controller generates phase measurement signals having voltages representative of the actual period of the output clock. These phase measurement signals are used to generate a control voltage, which is representative of both the actual period of the output clock, and the cycle-to-cycle deviation of successive periods of the output clock. The control voltage is applied to the VCO. The VCO adjusts the actual period of the output clock toward a desired period in response to the control voltage. The architecture of the present invention improves the jitter performance of a PLL circuit by at least a factor of five.

The present invention will be more fully understood in view of the following description and drawings.

DETAILED DESCRIPTION

Figure 1:
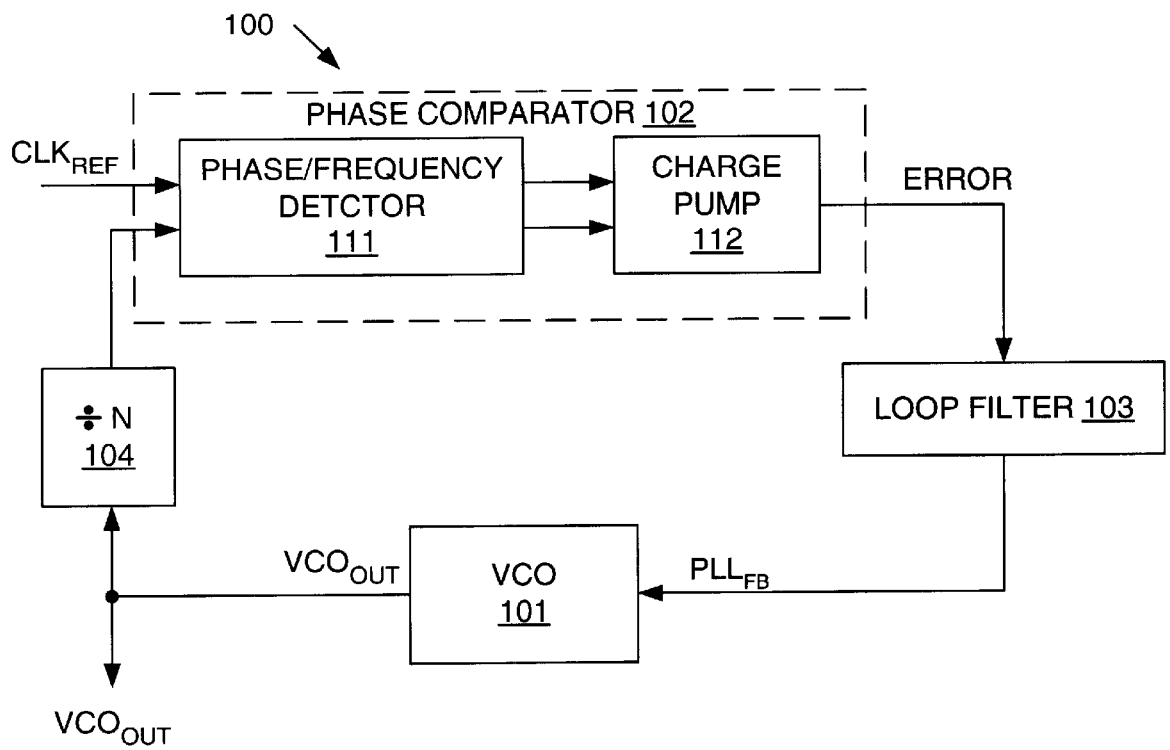
FIG. 1 is a block diagram of a conventional phase-locked loop (PLL) circuit.
Figure 2:
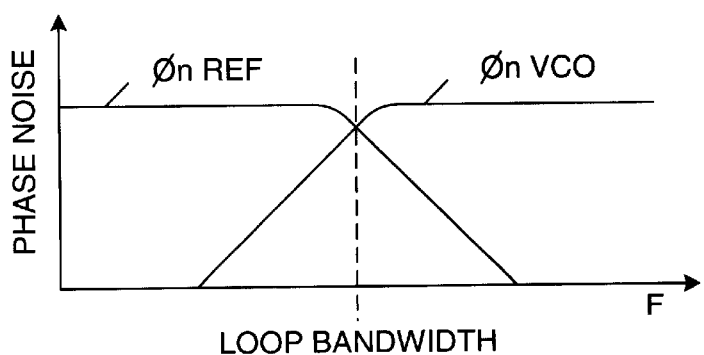
FIG. 2 is a waveform diagram illustrating the transfer functions for reference clock noise and voltage controlled oscillator noise of the PLL circuit of FIG. 1.
Figure 3:
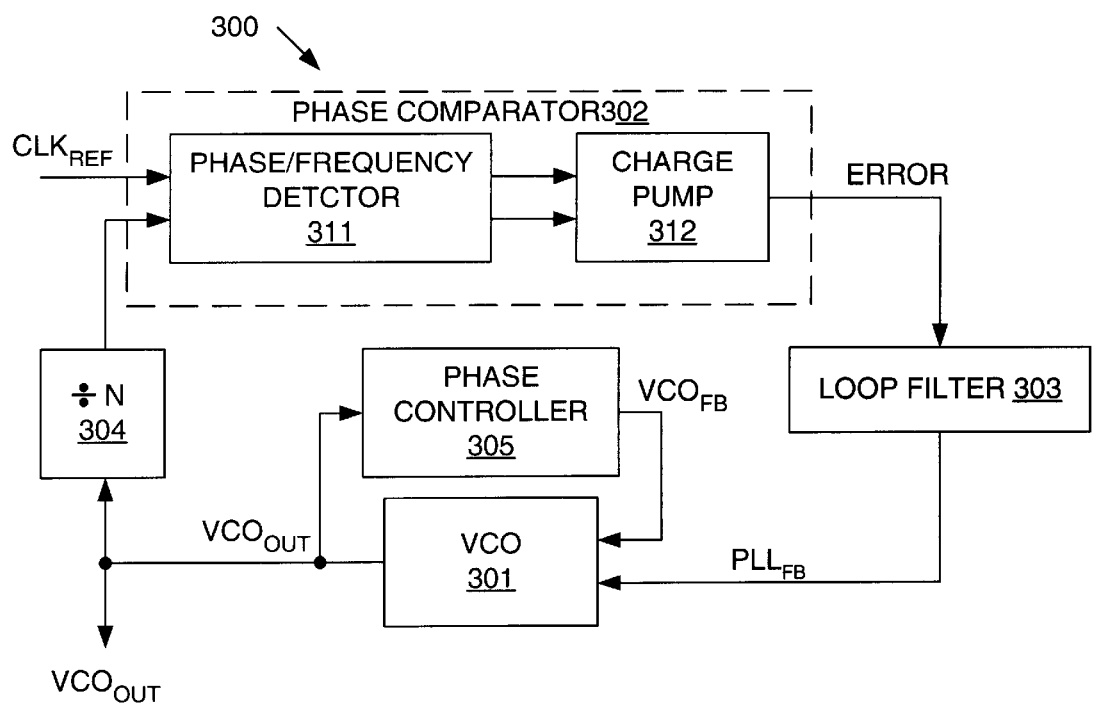
FIG. 3 is a block diagram of a PLL circuit that includes a phase controller coupled to a voltage-controlled oscillator (VCO) in accordance with one embodiment of the present invention.

FIG. 3 is a block diagram of a phase-locked loop (PLL) circuit 300 in accordance with one embodiment of the present invention. PLL circuit 300 includes voltage controlled oscillator (VCO) 301, phase comparator 302, loop filter 303, divider circuit 304 and phase controller 305. Phase comparator 302 includes phase/frequency detector 311 and charge pump 312. PLL circuit 300 is connected in a similar manner as PLL circuit 100 (FIG. 1). However, PLL circuit 300 includes two feedback loops. The first feedback loop is the PLL feedback loop that includes VCO 301, phase comparator 302, loop filter 303 and divider circuit 304. The basic operation of this PLL feedback loop is similar to the operation of PLL circuit 100 (FIGS. 1 and 2). The second feedback loop is the VCO feedback loop that includes VCO 301 and phase controller 305.

VCO 301 generates the output clock signal $VCO_{OUT}$, which is provided to phase comparator 302 through optional divider circuit 304. In the described embodiment, divider circuit 304 implements a divide-by-one function. Although the present invention is applicable to any type of voltage controlled oscillator, VCO 301 is either a ring oscillator type VCO, or an LC based VCO in the described embodiments. Phase comparator 302 also receives the reference clock signal $CLK_{REF}$, and in response, provides an output signal (ERROR) that is representative of the phase difference between the $CLK_{REF}$ and $VCO_{OUT}$ signals. This output signal is filtered by loop filter 303 and provided to VCO 301 as the $PLL_{FB}$ feedback control signal.

Phase controller 305 is coupled to VCO 301 in accordance with one embodiment of the present invention. The $VCO_{OUT}$ signal is applied to an input terminal of phase controller 305. In response to the $VCO_{OUT}$ signal, phase controller 305 provides a $VCO_{FB}$ feedback signal to VCO 301. VCO 301 generates the output signal $VCO_{OUT}$ in response to the $VCO_{FB}$ and $PLL_{FB}$ feedback control signals. In one embodiment, the $VCO_{FB}$ signal is added to the $PLL_{FB}$ signal, thereby creating a single internal feedback signal for controlling VCO 301.

In general, phase controller 305 detects the actual period of the $VCO_{OUT}$ signal, and compares this period against a desired period of the $VCO_{OUT}$ signal. When phase controller 305 detects that the actual period is more or less than the desired period, phase controller 305 generates an appropriate negative feedback control voltage $VCO_{FB}$, which is provided to an input terminal of VCO 301. In response, VCO 301 adjusts the period of the $VCO_{OUT}$ signal. The $VCO_{FB}$ signal is selected to adjust the actual period of the $VCO_{OUT}$ signal toward the desired period. As a result, noise associated with the $VCO_{OUT}$ signal is significantly reduced. As described below, reducing the noise of the $VCO_{OUT}$ signal allows the loop bandwidth of PLL circuit 300 to be reduced. By reducing the loop bandwidth, the noise associated with the reference clock signal $CLK_{REF}$ is significantly attenuated. As a result, the jitter transferred to the output clock signal $VCO_{OUT}$ is substantially reduced.

Phase controller 305 will now be described in more detail. Phase controller 305 measures the cycle-to-cycle differences in the period of the $VCO_{OUT}$ signal, and in response, modifies the $VCO_{FB}$ signal in order to minimize these cycle-to-cycle differences.

Figure 4:
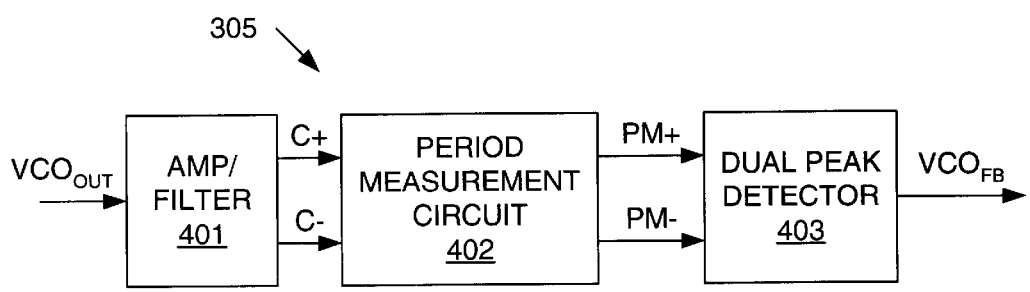
FIG. 4 is a block diagram illustrating a phase controller in accordance with one embodiment of the present invention.

FIG. 4 is a block diagram illustrating phase controller 305 in accordance with one embodiment of the present invention. Phase controller 305 includes amplifier/filter 401, period measurement circuit 402 and dual peak detector 403. In general, amplifier/filter 401 is a conventional circuit that filters various power supply voltages, thereby creating regulated control voltages $V_{DDR}$, $N_{BIAS}$, and $N_{BIASC}$. Amplifier/filter 401 also amplifies the $VCO_{OUT}$ signal, thereby creating a complementary pair of clock signals C+ and C−, each having a full signal swing between the $V_{DDR}$ voltage and ground, and each having a period equal to the period of the $VCO_{OUT}$ signal. The clock signals C+ and C− are applied to period measurement circuit 402. In response, period measurement circuit 402 generates a complementary pair of period measurement signals PM+ and PM−. Each of these signals PM+ and PM− is a triangle-like wave having a magnitude representative of the period of the corresponding clock signals C+ and C−. Dual peak detector 403 includes a pair of peak detector circuits for receiving the PM+ and PM− signals. One of the peak detector circuits generates a voltage representative of the peak of the PM+ signal, and the other one of the peak detector circuits generates a voltage representative of the peak of the PM− signal. The voltages generated by the two peak detectors alternately charge a storage capacitor to create the $VCO_{FB}$ feedback voltage, which has a voltage representative of the measured (actual) period of the $VCO_{OUT}$ signal, as well as the cycle-to-cycle deviation in the actual period of the $VCO_{OUT}$ signal. This $VCO_{FB}$ voltage is provided as a negative feedback signal to VCO 301. VCO 301 compares the $VCO_{FB}$ signal with a predetermined signal representative of the desired period of the $VCO_{OUT}$ signal. VCO 301 then adjusts the $VCO_{OUT}$ signal in view of the $VCO_{FB}$ signal to provide a $VCO_{OUT}$ signal that has the desired period. It is important to note that phase controller 305 directly measures the actual period of the $VCO_{OUT}$ signal in response to the $VCO_{OUT}$ signal. That is, phase controller 305 does not measure the period of the $VCO_{OUT}$ signal by comparing this signal with a separate reference clock signal.

Figure 5:
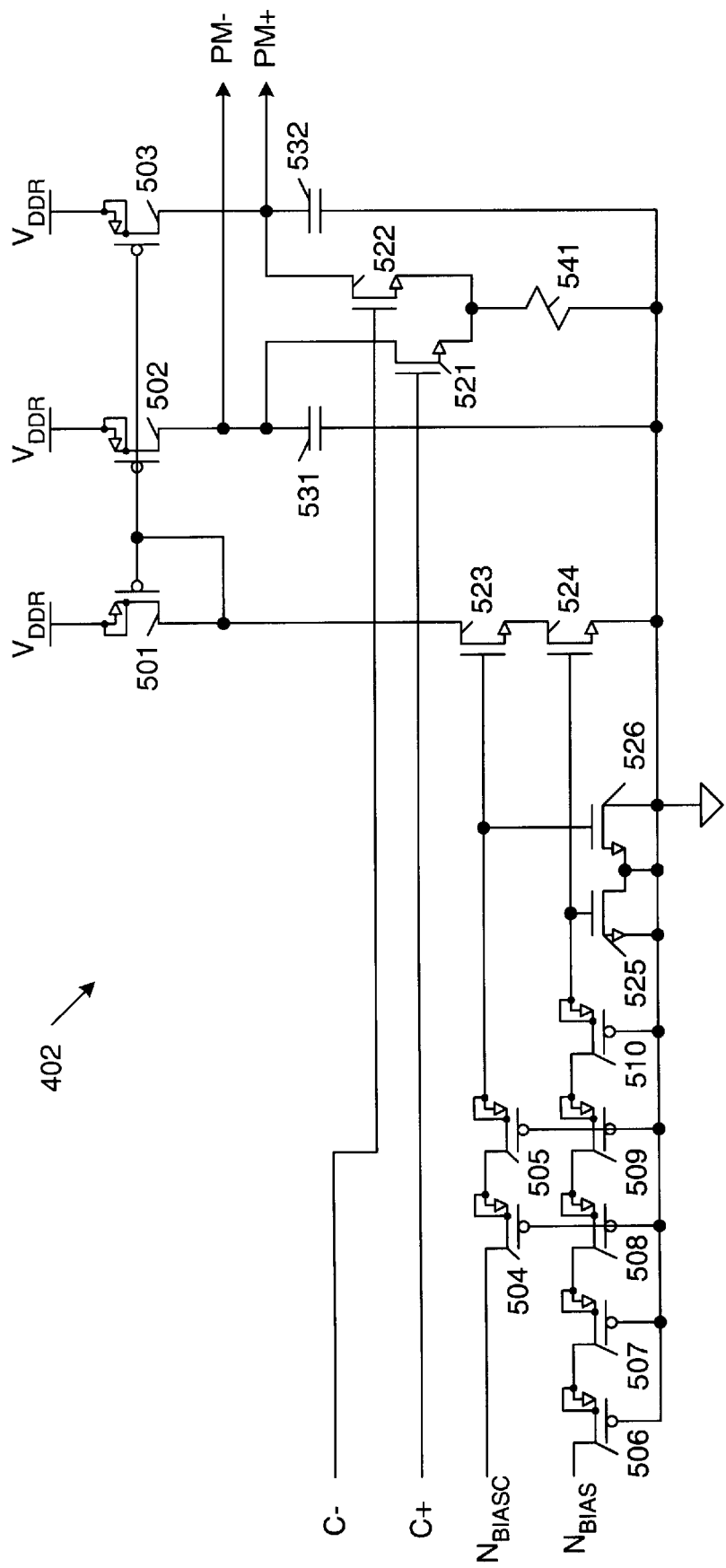
FIG. 5 is a circuit diagram of a period measurement circuit in accordance with one embodiment of the present invention.

FIG. 5 is a circuit diagram of period measurement circuit 402 in accordance with one embodiment of the present invention. Period measurement circuit 402 includes p-channel transistors 501–510, n-channel transistors 521–526, capacitors 531–532 and resistor 541. P-channel transistors 504–505 are connected in series between the gate of n-channel transistor 523 and a terminal receiving the $N_{BIASC}$ voltage. P-channel transistors 506–510 are connected in series between the gate of n-channel transistor 524 and a terminal receiving the $N_{BIAS}$ voltage. In the described embodiment, the $N_{BIASC}$ and $N_{BIAS}$ voltages have levels of about 1.2 Volts and 0.7 Volts, respectively. The gates of p-channel transistors 504–510 are coupled to ground, such that these transistors are turned on. As a result, the $N_{BIASC}$ and $N_{BIAS}$ voltages are applied to the gates of n-channel transistors 523 and 524, respectively. N-channel transistors 525 and 526 are coupled as capacitors between ground and the gates of n-channel transistors 524 and 523, respectively, thereby helping to maintain a constant bias on these transistors 523–524.

During normal operation, the turned on n-channel transistors 523–524 are configured to bias the gates of p-channel transistors 501–503. The sources of p-channel transistors 501–503 are all coupled to receive the regulated $V_{DD}$ supply voltage, $V_{DDR}$, which has a voltage of about 1.5 to 1.6 Volts in the described embodiment. The gate and drain of p-channel transistor 501 are commonly coupled to the drain of transistor 524. As a result, a current mirror circuit is formed, such that the current through transistor 501 is mirrored to both transistor 502 and transistor 503. The current through transistor 501 is determined by the biasing of transistors 523 and 524.

Capacitors 531 and 532 are connected between ground and the drains of transistors 502 and 503, respectively. The drains of transistors 502 and 503 are also coupled to the drains of n-channel transistors 521–522, respectively. Resistor 541 is coupled between ground and the sources of n-channel transistors 521–522. The gates of n-channel transistors 521–522 are coupled to receive the C+ and C− signals, respectively.

Figure 6:
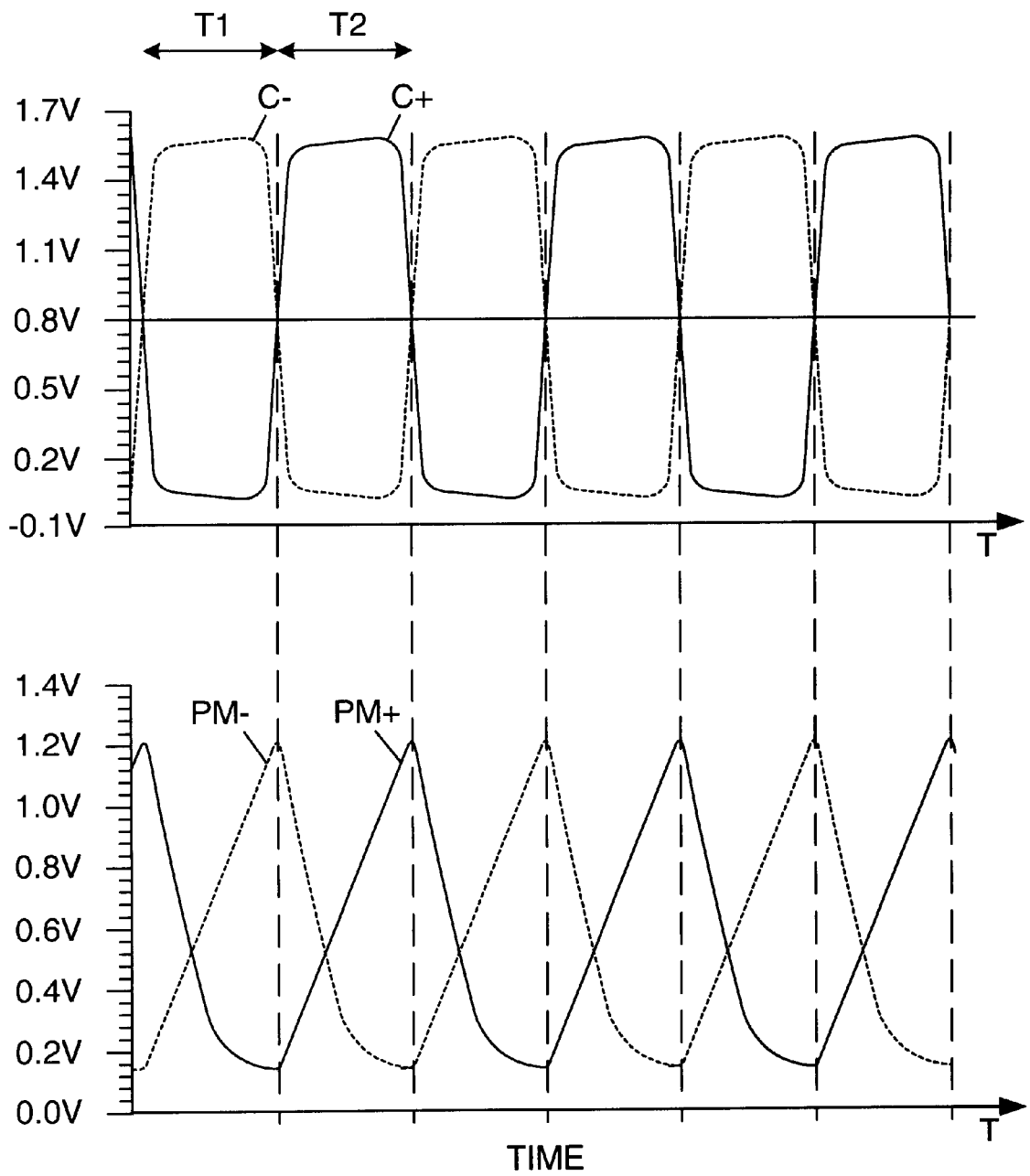
FIG. 6 is a waveform diagram illustrating the operation of the period measurement circuit of FIG. 5 in accordance with the described embodiment.

FIG. 6 is a waveform diagram illustrating the operation of period measurement circuit 402 in accordance with the described embodiment. During a first half period T1, the C− signal has a logic high value and the C+ clock signal has a logic low value. N-channel transistor 522 is turned on in response to the logic high C− signal, and n-channel transistor 521 is turned off in response to the logic low C+ signal. At this time, capacitor 532 discharges through turned on transistor 522 and resistor 541. Thus, during half period T1, the PM+ signal exhibits a decreasing value with a time constant of RC, where R is approximately equal to the resistance of resistor 541, and C is approximately equal to the capacitance of capacitor 532. The time constant RC is selected such that capacitor 532 is always discharged to about the same voltage. This is accomplished by selecting the time constant to have a value that is ⅕ or less than the expected half period.

Also during half period T1, capacitor 531 is charged through transistor 502, with the charging current being determined by the current mirror circuit. Capacitor 531 is charged for the duration of the half period T1. Thus, the charge stored by capacitor 531 (and thereby the voltage on capacitor 531) is directly related to the duration of the half period T1. Thus, the PM− signal increases during the half period T1.

At the end of half period T1 (i.e., the beginning of half period T2), the C− clock signal transitions to a logic low voltage, and the C+ clock signal transitions to a logic high voltage. N-channel transistor 521 is turned on in response to the logic high C+ signal, and n-channel transistor 522 is turned off in response to the logic low C− signal. At this time, capacitor 531 discharges through turned on transistor 521 and resistor 541. Thus, during half period T2, the PM− signal exhibits a decreasing value with time constant RC. The time constant RC is selected such that capacitor 531 is always discharged to about the same voltage. In the described example, capacitors 531–532 are identical, and transistors 521 and 522 are identical. Thus, the time constant for discharging capacitor 531 is identical to the time constant for discharging capacitor 532.

Also during half period T2, capacitor 532 is charged through transistor 503, with the charging current being determined by the current mirror circuit. Capacitor 532 is charged for the duration of the half period T2. Thus, the charge stored by capacitor 532 (and thereby the voltage on capacitor 532) is directly related to the duration of the half period T2. Thus, the PM+ signal increases during the half period T2.

The PM+ and PM− signals continue to charge and discharge in the above-described manner, thereby forming the triangle-like waveforms illustrated in FIG. 6. Although the peaks of these PM+ and PM− signals are shown to be approximately the same in FIG. 6, it is understood that these peaks will vary as the periods of the C+ and C− signals vary.

Figure 7:
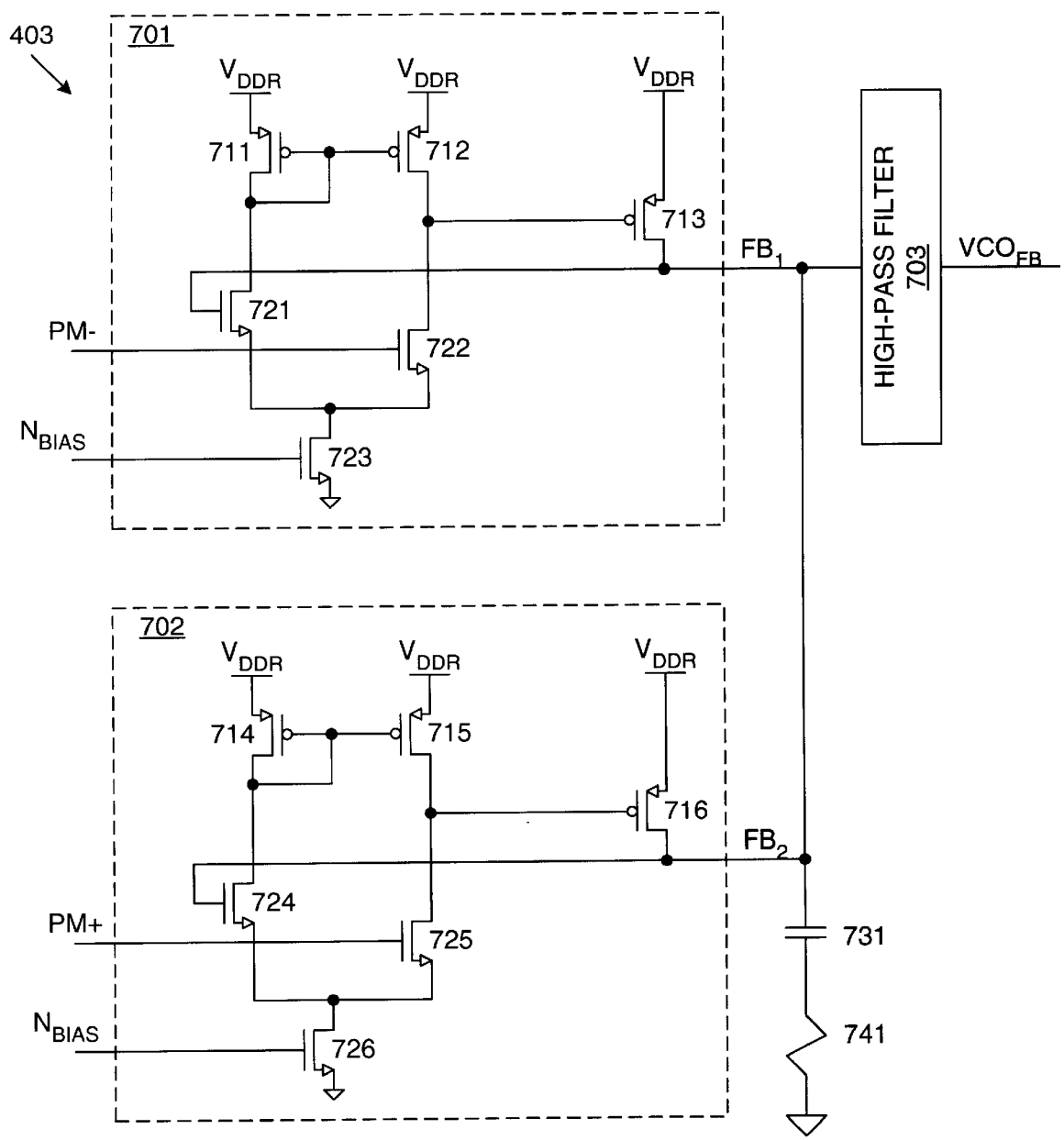
FIG. 7 is a circuit diagram of a dual peak detector in accordance with one embodiment of the present invention.

FIG. 7 is a circuit diagram of dual peak detector 403 in accordance with one embodiment of the present invention. Dual peak detector 403 includes a first peak detector 701, which is coupled to receive the PM− signal, a second peak detector 702, which is coupled to receive the PM+ signal, and an optional high pass filter 703. Peak detector 701 includes p-channel transistors 711–713 and n-channel transistors 721–723. Transistors 711 and 721 are connected in series between the $V_{DDR}$ supply terminal and the drain of transistor 723. Similarly, transistors 712 and 722 are connected in series between the $V_{DDR}$ supply terminal and the drain of transistor 723. The source of transistor 723 is coupled to ground, and the gate of transistor 723 is coupled to receive the $N_{BIAS}$ voltage. The gates of transistors 711 and 712 are commonly connected to the drain of transistor 711. The gate of transistor 722 is coupled to receive the PM− signal. Transistor 713 includes a source coupled to the $V_{DDR}$ supply terminal, a gate coupled to the drain of transistor 712, and a drain coupled to the gate of transistor 721 and the output terminal of peak detector 701. Peak detector 701 provides feedback output signal $FB_1$ in response to the PM− signal.

Peak detector 702 includes p-channel transistors 714–716 and n-channel transistors 724–726, which are configured in the same manner as transistors 711–713 and 721–723 of peak detector 701. Peak detector 702 provides feedback output signal $FB_2$ in response to the PM+ signal. The feedback signals $FB_1$ and $FB_2$ are provided to capacitor 731 and resistor 741, which effectively add the $FB_1$ and $FB_2$ signals to create a combined $FB_1/FB_2$ signal. High pass filter 703 is a conventional filter that filters the low frequency components of the combined $FB_1/FB_2$ signal to create the $VCO_{FB}$ signal.

Dual peak detector 403 operates as follows. Transistors 723 and 726 are turned on in response to the $N_{BIAS}$ voltage. When the PM− signal has a voltage higher than the $FB_1/FB_2$ signal, transistor 722 turns on, thereby pulling the gate of transistor 713 down to a logic low voltage. Under these conditions, transistor 713 turns on, thereby pulling up the $FB_1/FB_2$ signal to a higher voltage having a value that is directly related to the peak voltage of the PM− signal (and the peak voltage of the PM+ signal during the previous half cycle). For example, a PM− signal having a peak of 1.20 Volts may cause the $FB_1/FB_2$ signal to be pulled up to a voltage of about 1.05 Volts. The $FB_1/FB_2$ voltage is stored by capacitor 731, and is routed through high-pass filter 703 to create the feedback signal $VCO_{FB}$. The $FB_1/FB_2$ voltage is also applied to the gate of transistor 721. When the PM− signal drops to a voltage less than the $FB_1/FB_2$ voltage, the voltage on the gate of transistor 713 is pulled up to a logic high level, thereby turning off transistor 713. At this time, capacitor 731 begins to discharge through resistor 741. The values of capacitor 731 and resistor 741 are selected such that the discharge of capacitor 731 is relatively slow compared to the charging of capacitor 731.

When the PM+ signal has a voltage greater than the $FB_1/FB_2$ voltage provided by capacitor 731, transistor 725 turns on, thereby pulling the gate of transistor 716 down to a logic low voltage. Under these conditions, transistor 716 turns on, thereby pulling up the $FB_1/FB_2$ signal to a value that is directly related to the peak voltage of the PM+ signal (and the peak voltage of the PM− signal during the previous half cycle). The $FB_2$ voltage is used to charge capacitor 731, and is also provided as the feedback signal $VCO_{FB}$. The $FB_1/FB_2$ signal is also applied to the gate of transistor 724. When the PM+ signal drops to a voltage less than the $FB_1/FB_2$ voltage, the voltage on the gate of transistor 716 is pulled up to a logic high level, thereby turning off transistor 716. At this time, capacitor 731 begins to discharge through resistor 741. This process continues in the above-described manner, with capacitor 731 alternately being charged by the PM− and PM+ signals.

Figure 8:
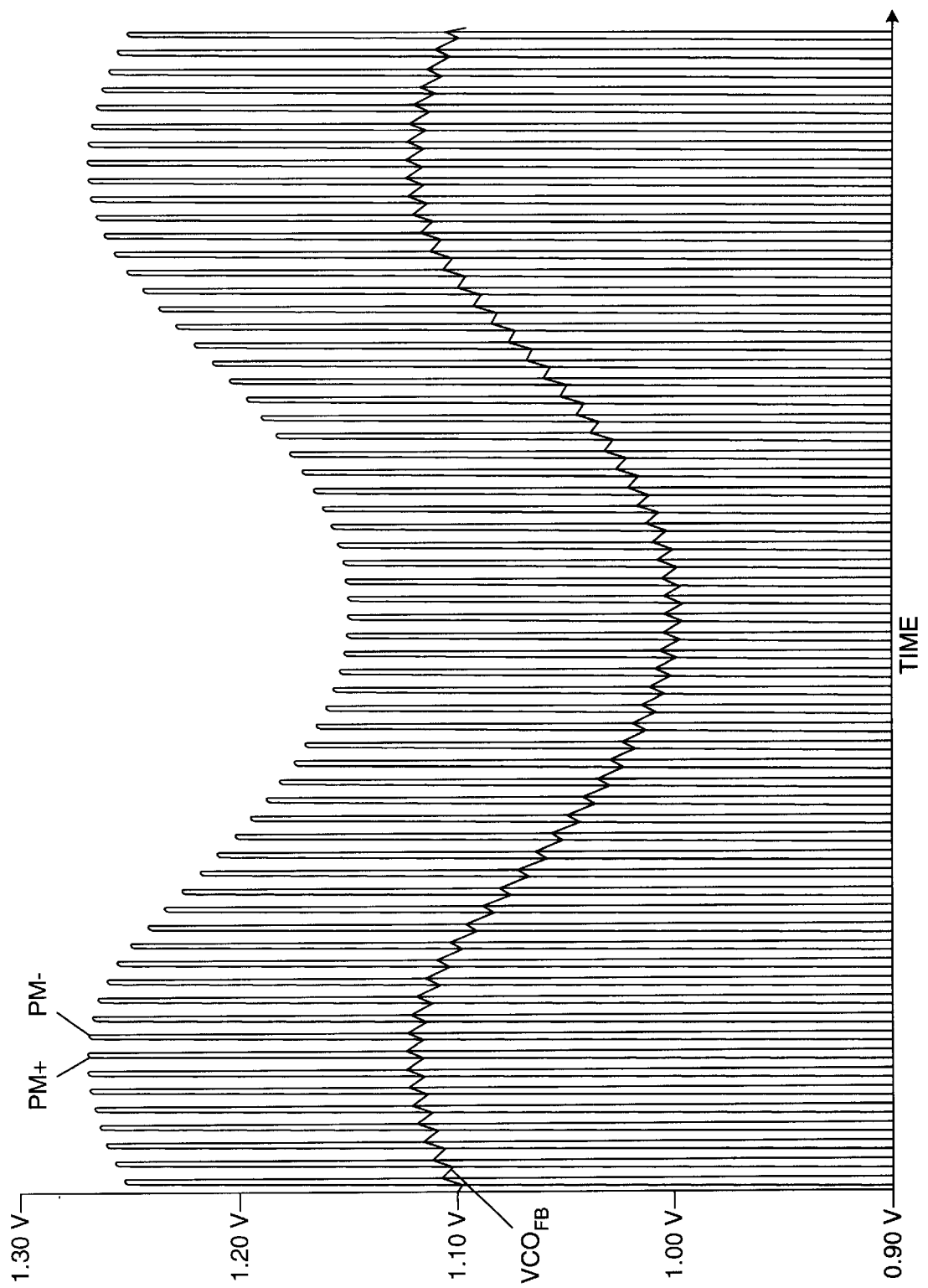
FIG. 8 is a waveform diagram illustrating the upper portions of period measurement signals PM− and PM+, and the resulting $VCO_{OUT}$ signal, in accordance with one embodiment of the present invention.

FIG. 8 is a waveform diagram illustrating the upper portions of PM− and PM+ signals, and the resulting $VCO_{FB}$ signal, in accordance with one embodiment of the present invention. In accordance with the previous description, the $VCO_{FB}$ signal increases (i.e., capacitor 731 charges) when the PM− or PM+ signal is greater than the $VCO_{FB}$ signal. Conversely, the $VCO_{FB}$ signal decreases (i.e., capacitor 731 discharges) when the PM− and PM+ signals are less than the $VCO_{FB}$ signal. Thus, the value of the $VCO_{FB}$ signal depends on both the peak values of the PM− and PM+ signals (i.e., the current period of the $VCO_{OUT}$ signal), and the previous values of the $VCO_{FB}$ signal (i.e., the previous periods of the $VCO_{OUT}$ signal). The $VCO_{FB}$ signal is therefore directly related to cycle-to-cycle variations in the period of the VCOOUT signal.

Figure 9:
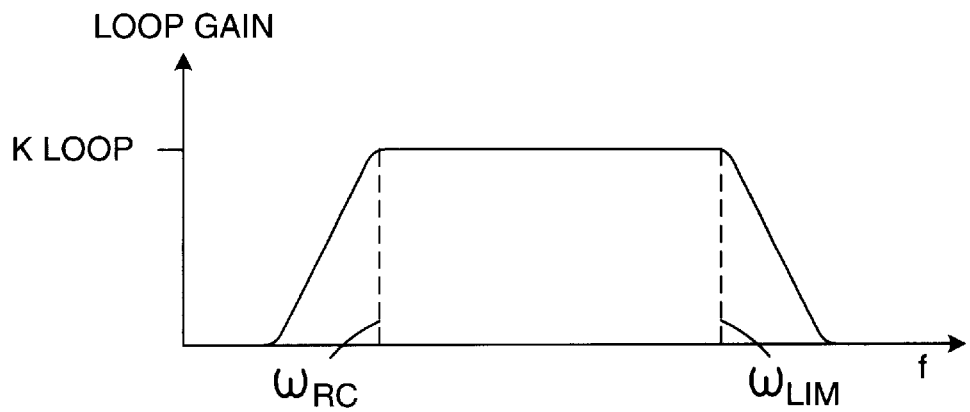
FIG. 9 is a graph illustrating the loop gain exhibited by a VCO loop in accordance with one embodiment of the present invention.

FIG. 9 is a graph illustrating the loop gain exhibited by the VCO loop formed by VCO 301 and phase controller 305 in accordance with the described embodiment. The frequency ωRC corresponds with the cut-off frequency of high pass filter 703 (i.e., the frequency at which low frequency signals begin to be cut off). The frequency ωRC is determined by resistance and capacitance values used to create high pass filter 703. The frequency (ωLIM corresponds with the upper frequency limit of phase controller 305. The phase noise of the VCO loop can be analyzed with respect to the response shown in FIG. 9. Note that if optional high pass filter 703 is not used, the loop gain would be equal to K LOOP for frequencies less than ωLIM (i.e., there would be no drop off at ωRC).

Figure 10:
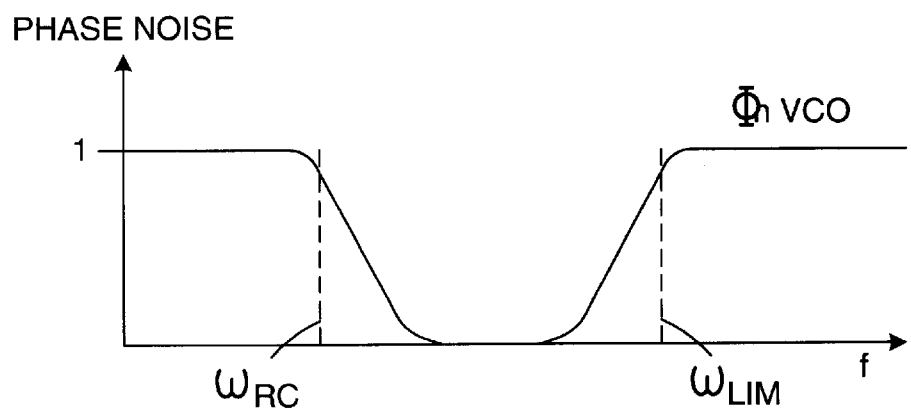
FIG. 10 is a graph illustrating the manner in which VCO noise is shaped as it passes through a VCO loop in accordance with one embodiment of the present invention.

FIG. 10 is a graph illustrating the manner in which any noise in VCO 301 (Φn VCO) will be shaped as it passes through the VCO loop formed by VCO 301 and phase controller 305. At frequencies lower than ωRC, the noise passes through the feedback loop of VCO 301 without being changed. Similarly, at frequencies higher than ωLIM, the noise passes through the feedback loop of VCO 301 without being changed. However between the frequencies of ωRC and ωLIM, the VCO noise is attenuated by the VCO loop formed by VCO 301 and phase controller 305, because the loop gain is high between these frequencies. If optional high pass filter 703 were not used, phase noise would not be passed at lower frequencies.

The PLL loop (which includes VCO 301, phase comparator 302, loop filter 303 and divider circuit 304) will operate as a high pass filter with respect to VCO noise. (See, FIGS. 1 and 2.) Consequently, the low frequency noise shown in FIG. 10 will be filtered out by the PLL loop if the loop bandwidth is chosen correctly.

Figure 11:
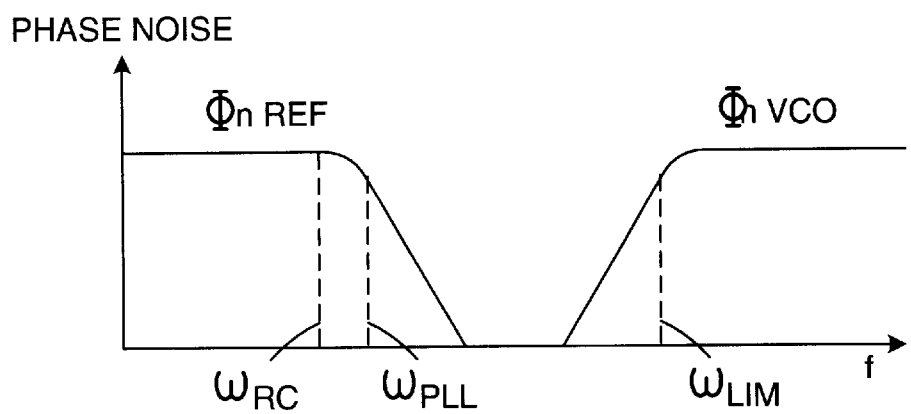
FIG. 11 is a graph that illustrates the response of the PLL circuit of FIG. 3 to both reference clock noise and VCO noise in accordance with one embodiment of the present invention.

FIG. 11 is a graph that illustrates the response of PLL circuit 300 to both reference clock noise Φn REF) and VCO noise (Φn VCO). PLL circuit 300 acts as a low-pass filter with respect to reference clock noise (Φn REF) and a high-pass filter with respect to VCO noise (Φn VCO). Note the phase controller 305 causes the VCO noise Φn VCO) curve to be shifted to the right with respect to the VCO noise curve of FIG. 2. Thus, at low frequencies (less than or equal to $\omega_{PLL}$), the reference clock noise (Φn REF) is passed through to the $VCO_{OUT}$ output of the PLL circuit 300, but the noise of VCO 301 (Φn VCO) is not. As the frequency increases (greater than $\omega_{PLL}$), the reference clock noise Φn REF) is reduced. Note that $\omega_{PLL}$ identifies the cut-off frequency associated with the PLL loop of PLL circuit 300. (See, e.g., FIGS. 1 and 2). As long as the frequency is less than $\omega_{LIM}$, the VCO noise Φn VCO) passed to the output of PLL circuit 300 is substantially attenuated by phase controller 305. At frequencies greater than $\omega_{LIM}$, phase controller 305 can no longer respond, so the VCO noise (Φn VCO) is passed to the output of PLL circuit 300.

Because the VCO noise (Φn VCO) has been cancelled in the manner illustrated in FIG. 11, the noise (jitter) translated by PLL circuit 300 to the $VCO_{OUT}$ signal is significantly reduced with respect to prior art PLL circuit 100 (FIG. 1).

PLL circuit 300 can be used in physical layer communication circuits, which perform functions including, but not limited to, clock synthesis, clock and data recovery, and serializing/deserializing functions. PLL circuit 300 can be implemented in devices including, but not limited to application specific standard parts (ASSPs) or field programmable gate arrays (FPGAs).

Although the invention has been described in connection with several embodiments, it is understood that this invention is not limited to the embodiments disclosed, but is capable of various modifications, which would be apparent to a person skilled in the art. For example, the present invention can be applied to any circuit that uses a voltage-controlled oscillator. In addition, the present invention can be applied to oscillators that are controlled by signals other than voltages. For example, the present invention is equally applicable to a current controlled oscillator. Moreover, the present invention can be applied to phase-locked loop circuits having other configurations than those described above. The invention can also be extended to include a time measuring circuit, which uses the frequency of the voltage-controlled oscillator to calculate the time of an event. It is believed that a 10 pico-second resolution of time measuring can be achieved using the present invention. The present invention can be used in any system that requires a low noise output with respect to jitter, including, but not limited to communications circuits and CPU clocking systems. The present invention can also be applied to a delay locked loop by providing a phase controller similar to phase controller 305 in a feedback configuration with a voltage controlled delay line of the delay locked loop. Thus, the invention is limited only by the following claims.

What is claimed is:

1. A method of operating a signal controlled oscillator that provides an output clock having an actual period, the method comprising:
   directly measuring successive actual periods of the output clock;
   generating a control signal representative of deviations in the successive actual periods of the output clock; and
   adjusting the actual period of the output clock in response to the control signal.

2. The method of claim 1, wherein the adjusting reduces the deviations in the successive actual periods of the output clock.

3. The method of claim 1, further comprising selecting a desired period of the output clock, wherein the adjusting forces the actual period of the output clock toward the desired period of the output clock.

4. The method of claim 1, wherein the control signal changes in a linear manner with respect to changes in the actual period.

5. The method of claim 1, wherein the control signal increases as the actual period increases, and decreases as the actual period decreases.

6. The method of claim 1, further comprising:
routing the output clock to a phase comparator;
routing a reference clock signal to the phase comparator;
generating an error signal representative of the difference between the output clock and the reference clock signal; and
controlling the signal controlled oscillator in response to the error signal.

7. A method of operating a signal controlled oscillator that provides an output clock having an actual period, the method comprising:
measuring successive actual periods of the output clock;
generating a control signal representative of deviations in the successive actual periods of the output clock;
filtering the control signal using a high-pass filter; and
adjusting the actual period of the output clock in response to the control signal.

8. A method of operating a signal controlled oscillator that provides an output clock having an actual period, the method comprising:
measuring successive actual periods of the output clock;
generating a control signal representative of deviations in the successive actual periods of the output clock, wherein the control signal is generated by:
generating a first signal having a magnitude corresponding with a first half period of the output clock;
generating a second signal having a magnitude corresponding with a second half period of the output clock; and
generating the control signal in response to the first signal and the second signal; and
adjusting the actual period of the output clock in response to the control signal.

9. The method of claim 8, wherein the first signal is generated by charging a first capacitor during each first half period of the output clock, and discharging the first capacitor to a predetermined level during each second half period of the output clock.

10. The method of claim 9, wherein the second signal is generated by charging a second capacitor during each second half period of the output clock, and discharging the second capacitor to the predetermined level during each first half period of the output clock.

11. The method of claim 8, further comprising generating the control signal charging a capacitor in response to the first and second signals.

12. The method of claim 11, further comprising:
charging the capacitor when the first signal or the second signal exceeds the control signal; and
discharging the capacitor when neither the first signal nor the second signal exceeds the control signal.

13. A signal controlled oscillator comprising:
means for directly measuring successive actual periods of an output clock provided by the signal controlled oscillator;
means for generating a control signal representative of deviations in the successive actual periods of the output clock; and
means for adjusting the actual period of the output clock in response to the control signal.

14. The signal controlled oscillator of claim 13, wherein the means for adjusting reduce the deviations in the successive actual periods of the output clock.

15. The signal controlled oscillator of claim 13, wherein the means for adjusting forces the actual period of the output clock toward a desired period of the output clock.

16. A signal controlled oscillator system comprising:
a signal controlled oscillator configured to generate an output clock having an actual period in response to an input signal;
a phase controller coupled to receive the output clock, the phase controller being configured to generate a control signal directly in response to the output clock, wherein the control signal is representative of cycle-to-cycle deviations in the actual period of the output clock; and
a feedback line for transmitting the control signal to the signal controlled oscillator.

17. A signal controlled oscillator system comprising:
a signal controlled oscillator configured to generate an output clock having an actual period in response to an input signal;
a phase controller coupled to receive the output clock, the chase controller being configured to generate a control signal representative of cycle-to-cycle deviations in the actual period of the output clock; and
a feedback line for transmitting the control signal to the signal controlled oscillator, wherein the signal controlled oscillator includes a circuit for combining the control signal with the input signal to create an internal input signal, the signal controlled oscillator generating the output clock in response to the internal input signal.

18. A The signal controlled oscillator system comprising:
a signal controlled oscillator configured to generate an output clock having an actual period in response to an input signal;
a phase controller coupled to receive the output clock, the phase controller being configured to generate a control signal representative of cycle-to-cycle deviations in the actual period of the output clock, wherein the phase controller includes an amplifier configured to generate a pair of complementary clock signals in response to the output clock; and
a feedback line for transmitting the control signal to the signal controlled oscillator.

19. The signal controlled oscillator system of claim 18, wherein the amplifier is configured to provide the complementary clock signals with a full signal swing between ground and a regulated supply voltage.

20. The signal controlled oscillator system of claim 18, wherein the phase controller further includes a period measurement circuit configured to generate a pair of period measurement signals in response to the complementary clock signals, wherein each of the period measurement signals has a peak magnitude representative of the actual period.

21. The signal controlled oscillator system of claim 20, wherein the phase controller further includes a dual peak detector configured to generate the control signal in response to the period measurement signals.

22. The signal controlled oscillator system of claim 20, wherein the period measurement circuit includes a pair of capacitors that are alternately charged and discharged in response to the complementary clock signals to create the period measurement signals.

23. The signal controlled oscillator system of claim 20, wherein the period measurement circuit includes:

a first capacitor;

a second capacitor;

a resistor;

a first transistor coupling the first capacitor to the resistor, wherein the first transistor is controlled by a first one of the complementary clock signals; and a second transistor coupling the second capacitor to the resistor, wherein the second transistor is controlled by a second one of the complementary clock signals.

24. A signal controlled oscillator system of comprising:

a signal controlled oscillator configured to generate an output clock having an actual period in response to an input signal;

a phase controller coupled to receive the output clock, the phase controller being configured to generate a control signal representative of cycle-to-cycle deviations in the actual period of the output clock;

a feedback line for transmitting the control signal to the signal controlled oscillator;

a phase comparator coupled to receive the output clock and a reference clock signal, the phase comparator being configured to generate an error signal representative of the difference between the output clock and the reference clock signal; and a loop filter coupled the phase comparator, the loop filter being configured to generate the input signal in response to the error signal.

25. A method of operating a signal controlled oscillator that generates an output clock, the method comprising:

measuring a first period of the output clock;

measuring a second period of the output clock, wherein the first period is a previous period with respect to the second period;

generating a feedback signal representative of a deviation between the first and second periods; and adjusting a third period of the output clock in response to the feedback signal.

26. The method of claim 25, wherein the adjusting reduces a deviation between the second period and the third period of the output clock.

\* \* \* \* \*